United States Patent
Hsieh et al.

(10) Patent No.: US 6,691,768 B2
(45) Date of Patent: Feb. 17, 2004

(54) HEATSINK DESIGN FOR UNIFORM HEAT DISSIPATION

(75) Inventors: Teh-Ming Hsieh, San Jose, CA (US); Bryan H. Tran, San Jose, CA (US); Julian A. Alipio, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/888,711

(22) Filed: Jun. 25, 2001

(65) Prior Publication Data

US 2002/0195229 A1 Dec. 26, 2002

(51) Int. Cl.[7] .............. F28F 7/00; B21D 53/02; H05K 7/20; H01L 23/34
(52) U.S. Cl. ............ 165/80.3; 165/185; 29/890.03; 174/16.3; 257/722; 257/720; 361/704
(58) Field of Search ............... 165/80.3, 185, 165/905; 257/720, 722; 29/890.03; 174/16.3; 361/704, 709; 403/364

(56) References Cited

U.S. PATENT DOCUMENTS

| | | | | |
|---|---|---|---|---|
| 4,823,869 A | * | 4/1989 | Arnold et al. | 165/185 |
| 4,908,695 A | * | 3/1990 | Morihara et al. | 257/720 |
| 4,918,571 A | * | 4/1990 | Grabbe | 174/16.3 |
| 5,256,902 A | * | 10/1993 | Culver | 257/722 |
| 5,574,626 A | * | 11/1996 | Smith | 361/704 |
| 5,844,313 A | * | 12/1998 | Hoffmann | 257/722 |
| 5,969,949 A | * | 10/1999 | Kim et al. | 361/704 |
| 5,992,511 A | * | 11/1999 | Kodaira et al. | 165/80.3 |
| 6,046,498 A | * | 4/2000 | Yoshikawa | 257/720 |
| 6,138,352 A | * | 10/2000 | Smith et al. | 165/80.3 |
| 6,382,306 B1 | * | 5/2002 | Hsu | 165/185 |
| 6,390,181 B1 | * | 5/2002 | Hall et al. | 165/80.3 |

FOREIGN PATENT DOCUMENTS

FR 2746251 A * 3/1997

* cited by examiner

Primary Examiner—Henry Bennett
Assistant Examiner—Tho v Duong
(74) Attorney, Agent, or Firm—Meyertons Hood Kivlin Kowert & Goetzel, P.C.; B. Noël Kivlin

(57) ABSTRACT

The present invention discloses improved heatsink designs and methods for cooling a heat source. One embodiment is a heatsink assembly for removing heat from an electronic component, the heatsink assembly comprising a copper-based core section having a first surface generally adapted to conform to an exposed mating surface of an electronic device and a second surface having a generally convex curvature having a greater surface area than the first surface. An aluminum-based outer section has a first surface comprising a concave curvature that is generally adapted to conform to the convex curvature of the core and a second surface. A plurality of fin elements protrude outwardly from the second surface of the outer section. At least one cooling fan can be positioned to direct airflow onto the fin elements. The core section can comprise a semi-spherical shape and can be joined by a finger-joint type connection to the outer section. A key design element of the present invention is the speed in which the heat is transferred away from the heat source. Due to a concentration of material having greater thermal conductivity located near the heat source, heat is allowed to transmit further and faster away from the source than with previous heatsink designs and is distributed more evenly throughout the main heatsink structure.

36 Claims, 5 Drawing Sheets

HEATSINK DESIGN FOR UNIFORM HEAT DISSIPATION

BACKGROUND OF THE INVENTION

1. Field of the Invention

This invention relates generally to heat transfer, and, more particularly, to heatsink assemblies to remove at least some of the heat produced by a heat source, such as an electronic component.

2. Description of Related Art

Electronic components such as integrated circuits or semiconductor chips, hereafter referred to as "chips", are well known and commonly used in the art to perform electronic functions. When in use, the chips often produce significant levels of heat. To reduce the heat generated, the chip size needs to be decreased which causes the heat to be concentrated into a smaller area. As technology has increased the capacity of the chips to perform functions, it has been found that the amount of concentrated heat produced has increased significantly. The increased level of heat produced by chips during their use can lead to a number of problems; for example, elevated levels of heat can potentially cause the chip to malfunction.

Various methods have been employed in the art to dissipate heat from chips. One method involves creating a forced airflow across the chip using a fan or blower. Another method involves mounting a heatsink on the surface of the chip. Heatsinks are typically manufactured from a metal having a high thermal conductivity, such as aluminum, and are mounted onto the surface of the chip to dissipate the heat produced by means of thermal conduction. Heatsinks typically comprise a plurality of parallel fins that are mounted on a base and which serve to facilitate the radiation and convection of the conducted heat by providing increased surface area. Copper is a better conductor of heat than aluminum, but a pure copper heatsink is seldom used due to cost and weight constraints. Often a fan or blower will be used to provide a forced airflow across the heatsink fins to increase their heat transfer capacity.

The two most significant modes of heat transfer are heat conduction and heat convection. Heat conduction is the transfer of heat through a solid medium. Heat conduction can be through a single solid medium or can be from one solid medium to another adjacent solid medium. The transfer of heat is based on a temperature differential, i.e. heat flowing from a hot end to a cold end, until temperature equilibrium between the ends is reached. Heat convection is the transfer of heat away from a hot solid medium to a cooler body of air. The air, typically ambient, has a generally constant temperature. Heat is convected away by the air currents generated by the warming of the air near the hot solid medium, or by a forced flow of air past the hot solid medium. Both conduction and convection are useful in providing heat dissipation from electrical devices.

The network of heat transfer pathways through which heat must flow determines the overall heat transfer characteristics. The heat must be conducted away from the chip and through the various thermal pathways to reach an outer surface of the heatsink that is exposed to the air where it can then be convected away from the outer surface to the ambient air body.

Each material has its own unique thermal characteristics, one of which is thermal conductivity. The thermal conductivity of a material determines the heat transfer capability through that material. Some materials, such as metals, have high thermal conductivity, while other materials such as glass or rubber have low thermal conductivity. Materials having low thermal conductivity are generally known as thermal insulators. Some commonly used semiconductor materials, such as glass and glass ceramic composites, have low thermal conductivities and therefore hinder the dissipation of heat.

As new semiconductor designs are becoming smaller and are capable of increased processing capacity, the amount of concentrated heat generated has increased dramatically. The commonly used methods of cooling that are mentioned above have sometimes been found to be inadequate for cooling high performance chips. Current aluminum heatsink designs often cannot dissipate heat from the chip fast enough. To compound the problem, very large scale integrated circuit chips are often mounted in close proximity to other heat generating chips on a printed circuit board, and frequently the circuit board is itself disposed within a confined area of an electronic device. Chips located in close proximity to each other will act as secondary heat sources on each other by radiant heat transfer, thereby increasing the amount of heat dissipation needed, while at the same time elevating the air temperature surrounding the chips, which acts to restrict the rate of total heat transfer.

Another area of concern with a heatsink design is airflow. The flow of air from a conventional circular fan blade creates an uneven airflow pattern, which often includes a "dead-zone" in the area that is not covered by the fan blades, i.e. the center of the motor for most fans. In a typical design, the heatsink and fan combination will be centered on the chip die, which is the primary heat source of the chip. Therefore, the hottest portion of the heatsink, which is located directly above the die, will often receive the least amount of airflow, creating a location on the heatsink having a heat concentration, or a "hot spot".

Another heatsink design sometimes used comprises a flat copper bottom segment that is attached to the main aluminum heatsink segment. This design attempts to balance the increased heat transfer capabilities of copper with the increased cost associated with its use. Heat is conducted away from the chip by the copper segment, then from the copper segment to the aluminum segment, and finally to the surface of the fins where the heat is convected to the air. Copper, having a thermal conductivity approximately double that of aluminum, can remove heat faster from the chip surface, thus aiding the chip cooling effort. But a flat copper plate often cannot distribute the heat from a localized source evenly across its surface, thereby resulting in a heat concentration, sometimes referred to as a hot spot, at the location of the heat source. A location on the heatsink having a hot spot can make the airflow patterns, and therefore the fan position, critical for adequate heat dissipation.

Having the airflow pattern and/or fan position as a critical factor in the ability of a chip to function properly is an undesired limitation on the ability to manufacture and package the chip within an electrical device. When the total packaging of a device can comprise numerous chips and other components confined within a very limited space, efficient heat dissipation with a reduced number of hot spots is desired.

There exists a need for an improved heatsink design that can quickly and effectively conduct heat away from the semiconductor chip and convect the heat to the air, while also minimizing hot spots within the heatsink.

SUMMARY OF THE INVENTION

One embodiment of the present invention is a heatsink assembly comprising a first section having a first surface and a second surface. The first surface is adapted to contact a surface of a heat source and the second surface has a generally convex curvature. A second section also has a first surface and a second surface, the first surface comprising a concave curvature and in contact with the second surface of the first section. A plurality of fin elements protrude from the second surface of the second section.

Another embodiment of the invention is a method for cooling a heat source by providing a heatsink comprising a core segment having a first surface adapted to contact the heat source and a second surface having a generally convex curvature and having a greater surface area than the first surface. An outer segment has a first surface with a generally concave curvature adapted to contact the second surface of the core segment, and a second surface having a plurality of fin elements protruding from it. The heatsink is attached to the heat source. The heat source is cooled by conducting heat from the heat source to the core segment, through the core segment in a radial direction to the greater surface area of the second surface of the core segment, and to the outer segment. From the outer surface heat is conducted to the fin elements and convected to a surrounding air mass.

BRIEF DESCRIPTION OF THE DRAWINGS

The invention may be understood by reference to the following description taken in conjunction with the accompanying drawings, in which.

Figure 1:
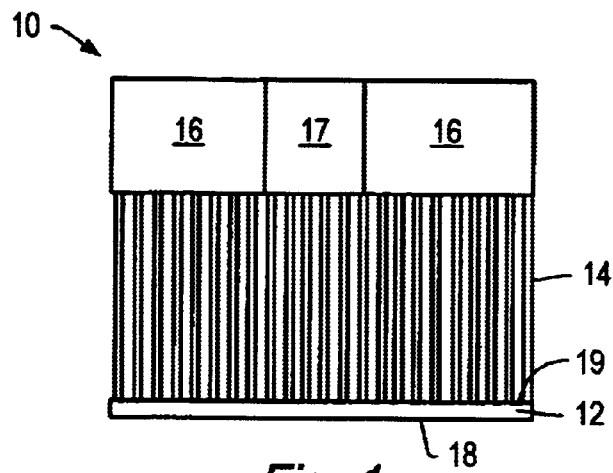
FIGS. 1 and 2 are side view illustrations of typical prior art heatsink designs.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DESCRIPTION OF ILLUSTRATIVE EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to the attached drawings, FIG. 1 shows a heatsink 10 comprising a base 12, a plurality of fins 14, a conventional cooling fan 16 and a conventional cooling fan motor 17. Typically the base 12 and fins 14 will be constructed of aluminum. The base 12 has a bottom surface 18 that will be in contact with a surface of a chip (not shown) and has a top surface 19 to which the fins 14 are attached. Heat from the chip is primarily generated from a portion of the chip called the die (not shown). The die is that section of the chip where the majority of electrical connections pass, thereby being the location having the greatest heat generation. Heat will be conducted from the die, through the base 12 and to the fins 14 where the heat will be convected to the surrounding air. The cooling fan 16 (shown stylistically), driven by the cooling fan motor 17 creates a forced airflow past the fins 14 to aid in the heat dissipation by convection from the fins 14.

Figure 2:
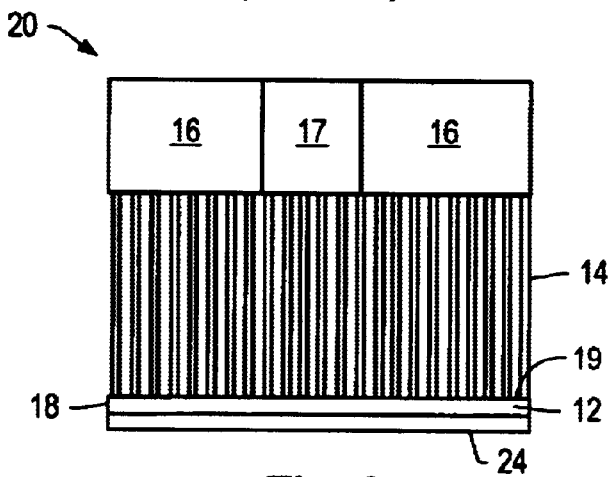

FIG. 2 shows a heatsink 20 having the same elements as the heatsink 10 illustrated in FIG. 1, but with the addition of a base plate 24 that is attached to the bottom surface 18 of the base 12. The base plate 24 lies between the heatsink base 12 and the chip and is typically made of copper. A copper base plate 24, having a greater thermal conductivity than the aluminum base 12, will remove heat from the chip faster than the aluminum base 12 is able to. The base plate 24 conducts heat from the chip to the base 12, where the heat is then conducted to the fins 14 for dissipation to the surrounding air.

Figure 3:
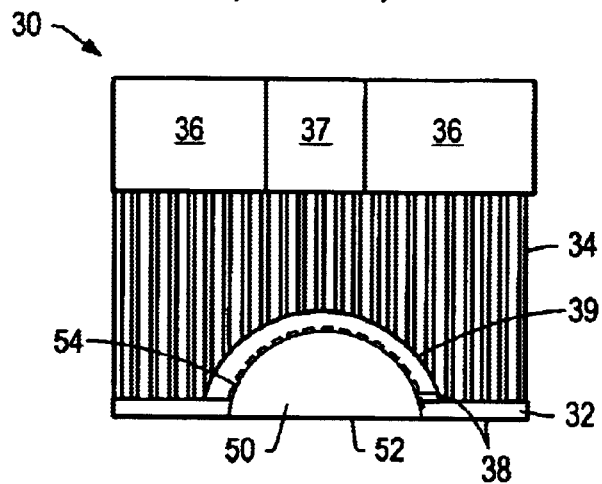
FIG. 3 shows a cross-sectional side view of one embodiment of a heatsink employing aspects of the present invention.

FIG. 3 is an illustration of a cross-sectional side view of an embodiment of the present invention. The heatsink 30 comprises a base 32, a plurality of fins 34, a cooling fan 36 and a cooling fan motor 37. A core element 50 is located within the heatsink 30, adjacent at least a portion of the base 32. The core element 50 has a lower surface 52 that is made to contact a surface of the chip and is generally flat, although other surface contours may be used to effectively match the contour of the chip to be cooled. An upper surface 54 of the core element 50 has a generally curved shape and is adapted to contact at least a portion of the bottom surface 38 of the base 32. Generally, the base 32 has a shape that substantially conforms to the core element 50 upper surface 54. The upper surface 54 has a greater surface area than the lower surface 52. The two-dimensional view of FIG. 3 shows the core element 50 having a semi-circular cross-section. A three-dimensional view of the core element 50 can be semi-spherical, semi-ellipsoid, semi-cylindrical, or other shapes having a surface curved in a radial direction, such as a bell shaped curvature, whether or not the surface is curved in a longitudinal direction.

One aspect of the present invention is the ability to dissipate heat quickly from the heat source, such as a semiconductor chip die, while also reducing the occurrence of hot spots within the heatsink 30. The core element 50 will usually be made of a material having a greater thermal conductivity than the base 32 or the fins 34, thereby removing heat quickly from the chip before conducting it to the base 32 and eventually to the fins 34 for final dissipation. The shape of the core element 50 enables a somewhat even temperature distribution over its upper surface 54, since the heat is being transferred in a outward radial pattern and the heat from the primary source, the chip die, can be distributed over a larger surface area. Having these radially extending thermal passageways enables heat to be conducted out through the core element 50, to the base 32 and the fins 34, while reducing hot spots within the heatsink 30. Reducing the occurrence and severity of hot spots on the heatsink 30 also reduces the problem associated with the "dead-zone" effect. A dead-zone is where an inadequate airflow exists in an area that is not covered by the cooling fan blades, such as adjacent the center of the spinning fan blade. Since the fan is often centered over the chip die, the dead-zone area is often located at a hot spot on the heatsink 30. By reducing the occurrence and severity of hot spots, the dead-zone effect has less impact on the ability of the heatsink to dissipate heat from the chip.

The core element 50 will typically be made of copper or a copper-based alloy, while the base 32 and fins 34 will typically be made of aluminum or an aluminum-based alloy, such as aluminum nitride. For good conduction of heat from the core element 50 to the base 32, the two contacting surfaces 38, 54 should have a substantial contact area. One option is for the surfaces 38, 54 to be bonded together in a manner such as gluing, but problems can sometimes arise when two materials having different thermal expansion rates are bonded together. The temperature of the heatsink 30 will vary greatly depending on whether the chip is in operation or not, creating a temperature fluctuation cycle. This temperature fluctuation cycle will expand and contract the heatsink materials, and if two materials having differing thermal expansion rates are bonded together, there will be forces imposed on them that will act to break the bond. A broken bonded connection can create debris and irregular surfaces, which can lead to air gaps between the surfaces. Air gaps will act as a thermal insulator, thus hindering the heat transfer across the contact surface. Methods of attaching the core element 50 to the base 32 include, for example, mechanical attachments such as wiring or banding, while still other means of attaching the two segments 50, 32 without bonding the contacting surfaces 38, 54 are known to those skilled in the art.

Figure 4:
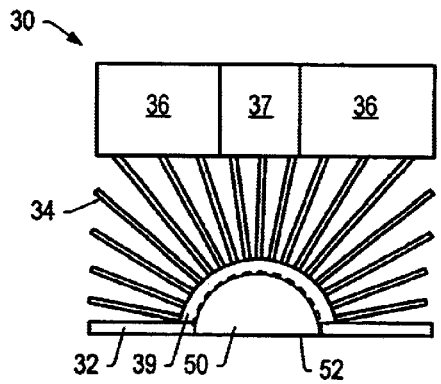
FIG. 4 shows a cross-sectional side view of an alternative embodiment of a heatsink employing aspects of the present invention comprising radially extending fins.
Figure 5:
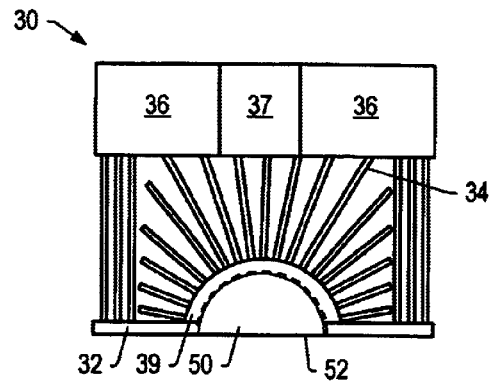
FIG. 5 shows a cross-sectional side view of an alternative embodiment of a heatsink employing aspects of the present invention comprising radially extending fins.

FIGS. 4 and 5 show embodiments of the present invention having fins 34 that extend out radially from the curved top surface 39 of the base 32. The radially extending fins 34 have the benefit of the air gap between adjacent fins increasing with increasing distance from the heat source. This can increase the airflow passing between the fins 34 and aid in heat dissipation through convection to the adjacent air mass from the fins 34.

Figure 6:
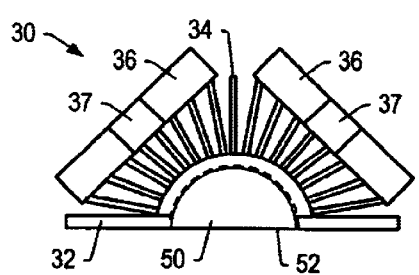
FIG. 6 shows a cross-sectional side view of an alternative embodiment of a heatsink employing aspects of the present invention comprising a plurality of cooling fans.

FIG. 6 is an illustration of an embodiment having multiple cooling fans 36 directing airflow parallel to some of the radially extended fins 34. Multiple cooling fans 36 can increase the air flow passing over the fins 34 and can also enable air flow from more than one direction to be directed on the fins 34.

Figure 7:
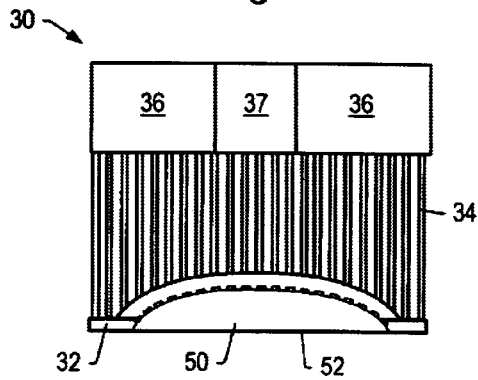
FIG. 7 shows a cross-sectional side view of an alternative embodiment of a heatsink employing aspects of the present invention.
Figure 8:
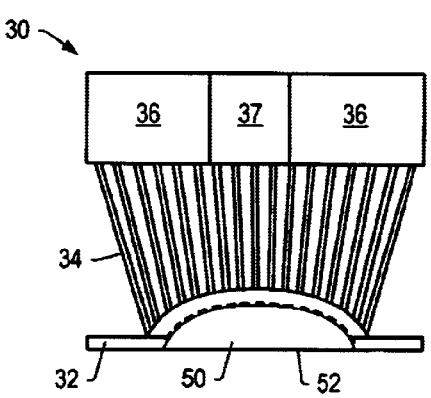
FIG. 8 shows a cross-sectional side view of an alternative embodiment of a heatsink employing aspects of the present invention.

FIGS. 7 and 8 show embodiments having an elliptical shaped core element 50. The semi-ellipsoid shape has a larger base area, or "footprint", than a semi-spherical shape, and therefore is able to cover and dissipate heat from a larger chip or from a chip containing a larger die.

Figure 9:
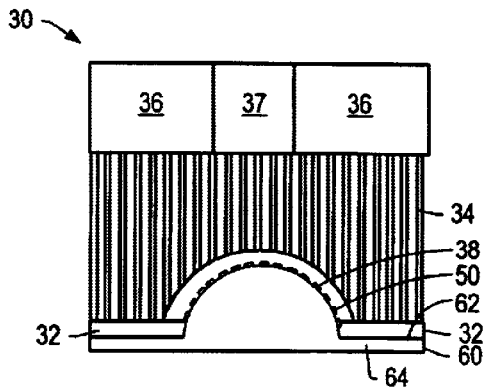
FIG. 9 shows a cross-sectional side view of an alternative embodiment of a heatsink employing aspects of the present invention.
Figure 10:
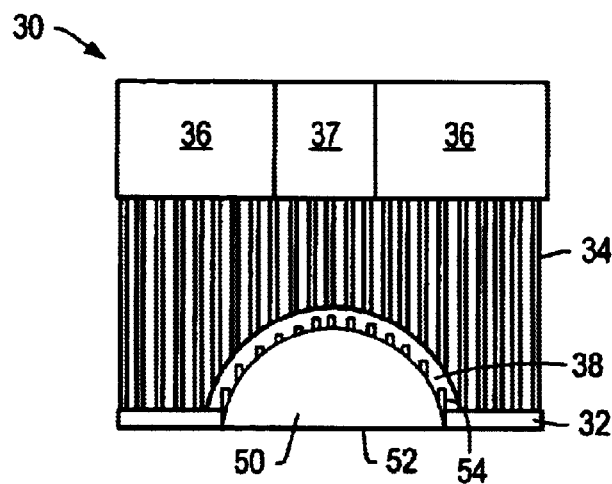
FIG. 10 shows a cross-sectional side view of an embodiment of a heatsink employing aspects of the present invention comprising a finger-joint connection.
Figure 11:
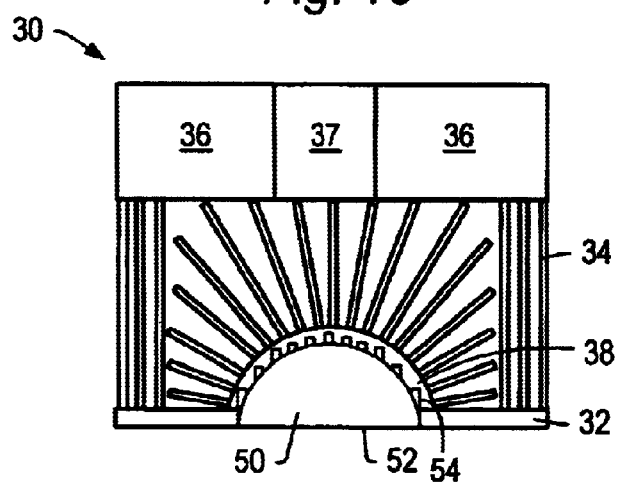
FIG. 11 shows a cross-sectional side view of an embodiment of a heatsink employing aspects of the present invention comprising a finger-joint connection.
Figure 12:
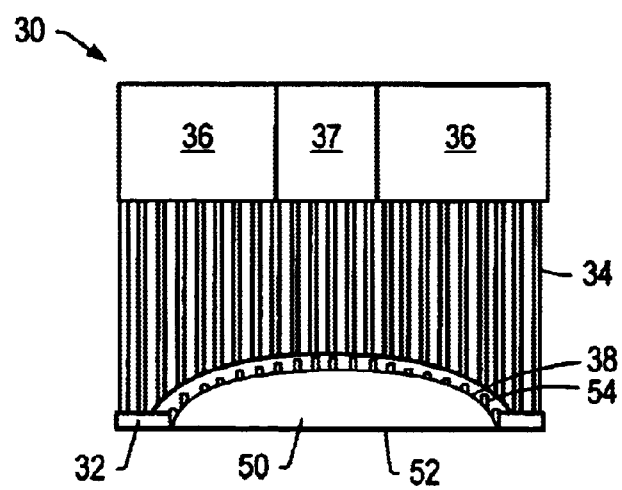
FIG. 12 shows a cross-sectional side view of an embodiment of a heatsink employing aspects of the present invention comprising a finger-joint connection.
Figure 13:
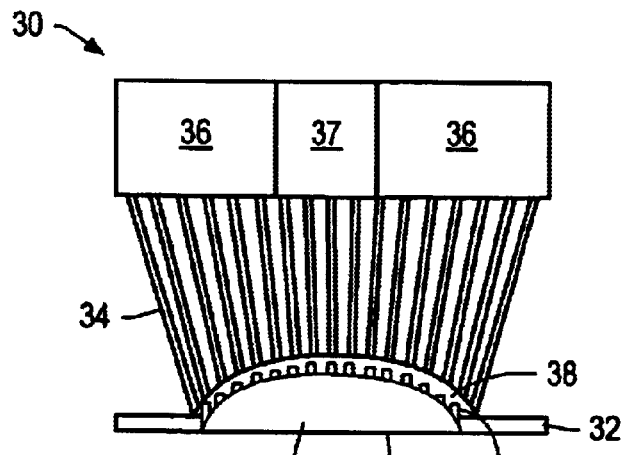
FIG. 13 shows a cross-sectional side view of an embodiment of a heatsink employing aspects of the present invention comprising a finger-joint connection.
Figure 14:
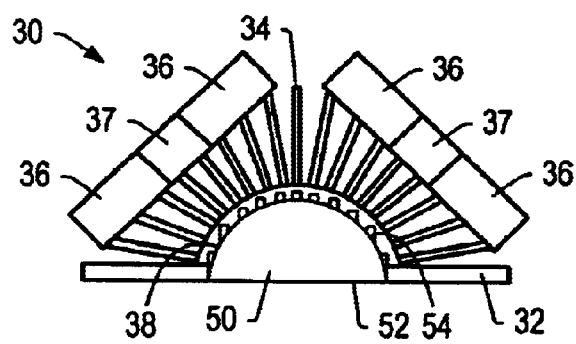
FIG. 14 shows a cross-sectional side view of an embodiment of a heatsink employing aspects of the present invention comprising a finger-joint connection.
Figure 15:
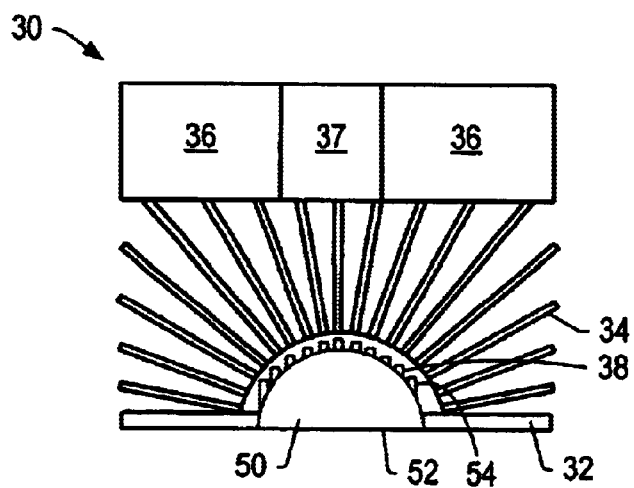
FIG. 15 shows a cross-sectional side view of an embodiment of a heatsink employing aspects of the present invention comprising a finger-joint connection.
Figure 16:
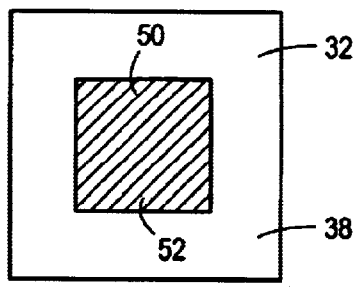
FIG. 16 shows a bottom view of an embodiment of a heatsink employing aspects of the present invention.
Figure 17:
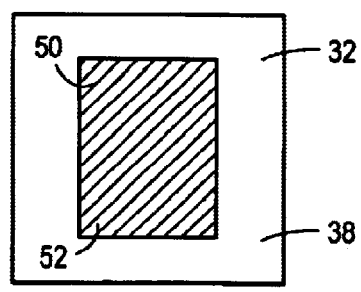
FIG. 17 shows a bottom view of an alternative embodiment of a heatsink employing aspects of the present invention.
Figure 18:
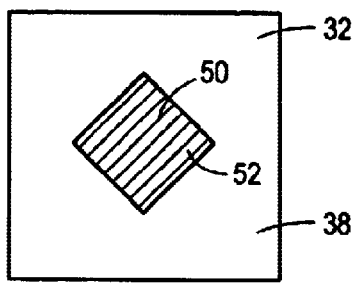
FIG. 18 shows a bottom view of an alternative embodiment of a heatsink employing aspects of the present invention.
Figure 19:
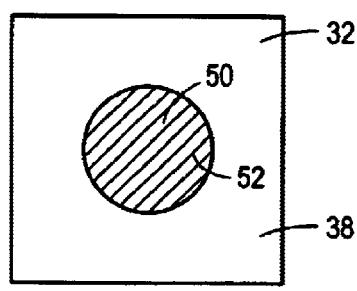
FIG. 19 shows a bottom view of an alternative embodiment of a heatsink employing aspects of the present invention.
Figure 20:
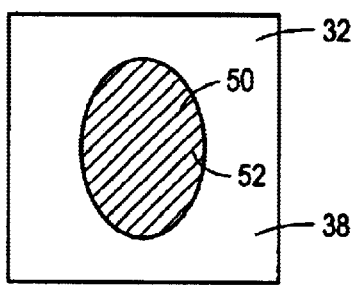
FIG. 20 shows a bottom view of an alternative embodiment of a heatsink employing aspects of the present invention.
Figure 21:
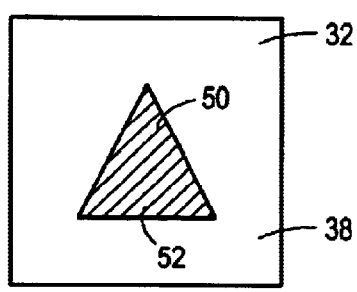
FIG. 21 shows a bottom view of an alternative embodiment of a heatsink employing aspects of the present invention.
Figure 22:
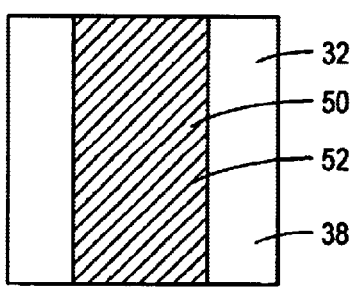
FIG. 22 shows a bottom view of an alternative embodiment of a heatsink employing aspects of the present invention.

FIG. 9 shows an alternate embodiment of the present invention that combines the features of the embodiment shown in FIG. 3 with a base plate 60 that is located below and in contact with the core element 50 and the base 32. The base plate 60 and the core element 50 can together comprise a single unit and both be made of copper or a copper-based alloy. The base plate 60 has a top surface 62 and a bottom surface 64. The bottom surface 64 acts as the core element 50 lower surface 52 when the core element 50 and the base plate 60 are considered as a single unit. A portion of the top surface 62 of the base plate 60 is in contact with the bottom surface 38 of the base 32.

As shown in FIGS. 10–15, embodiments of the present invention can include a finger-joint connection between the core element 50 and the base 32. The finger-joint connection increases the contact area of the surfaces 38, 54 and ensures multiple contact points throughout the temperature fluctuation cycles. A finger joint connection of two bodies is where one or both bodies contain projections, or fingers, from the contacting surface. The projections of one body are inserted into mating recesses in the other body, resulting in an interlinking if the contact surfaces and an increase in the contact area. A cross-section of a finger joint connection can have the appearance of alternating fingers, such as FIG. 10, interconnected gears or other possible embodiments.

FIGS. 16–22 show bottom views of embodiments of a heat sink comprising aspects of the present invention. The core element 50 footprint can comprise various shapes within the bottom surface 38 of the base 32, for example, round, oval, square, and rectangular. When placed on the heat source (not shown), the core element 50 will typically be centered on and placed in contact with the heat source. Although FIGS. 16–22 show the core element 50 footprint centered within the bottom surface 38 of the base 32, it would not need to be centered and may be located off center for better contact with the heat source.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A heatsink assembly comprising:
   a first section having a first surface and a second surface, the first surface to contact a surface of a heat source, the second surface having a generally convex curvature;
   a second section having a third surface and a fourth surface, the third surface comprising a concave curvature and in direct physical contact with the second surface of the first section; and
   a plurality of fin elements protruding from the fourth surface of the second section;
   wherein the first and second sections are joined by a finger-joint type connection.

2. The assembly of claim 1, further comprising:
   at least one cooling fan positioned to direct an airflow onto at least one of the fin elements.

3. The assembly of claim 2, wherein the at least one cooling fan is attached to at least one of the fin elements.

4. The assembly of claim 1, wherein the first section is made from a material that has a greater thermal conductivity than the second section, the first section creating radially extending thermal pathways.

5. The assembly of claim 1, wherein the first section comprises a copper based material.

6. The assembly of claim 1, wherein the second section comprises an aluminum based material.

7. The assembly of claim 1, wherein the second surface of the first section has a semi-spherical curvature and has a greater surface area than the first surface of the first section.

8. The assembly of claim 1, wherein the second surface of the first section has a semi-ellipsoid curvature and has a greater surface area than the first surface of the first section.

9. The assembly of claim 1, wherein the second surface of the first section has a semi-cylindrical curvature and has a greater surface area than the first surface of the first section.

10. The assembly of claim 1, wherein the first section comprises a base plate having a top surface and a bottom surface, the bottom surface comprising the first surface of the first section, and a portion of the top surface in contact with a portion of the first surface of the second section.

11. The assembly of claim 1, wherein at least one of the fin elements extend perpendicular from the fourth surface of the second section.

12. The assembly of claim 1, wherein the fourth surface of the second section comprises a convex curvature.

13. The assembly of claim 12, wherein at least one of the fin elements extend radially from the convex curvature of the second surface of the second section.

14. A heatsink assembly for removing at least a portion of the heat produced by an electronic component during use, the heatsink assembly comprising:
   a lower section having a first surface, a second opposing surface, an edge and a thickness, the first surface being generally flat to contact a surface of the electronic component, the second surface having a generally convex curvature such that the lower section has a greater thickness in its center than at its edge;
   an upper section having a third surface and a fourth surface, the third surface configured to directly contact the second surface of the lower section, the fourth surface comprising a convex curvature; and
   a plurality of fin elements protruding outward from the fourth surface of the upper section;
   wherein the upper and lower sections are joined by a finger-joint type connection.

15. The assembly of claim 14, wherein the lower section is made from a material that has a greater thermal conductivity than the upper section, the lower section providing radially extending thermal pathways from the electrical component to the upper section.

16. The assembly of claim 14, wherein the lower section comprises a copper-based material.

17. The assembly of claim 14, wherein the upper section comprises an aluminum-based material.

18. The assembly of claim 14, wherein the second surface of the lower section has a semi-spherical curvature and has a greater surface area than the first surface of the lower section.

19. The assembly of claim 14, wherein the second surface of the lower section has a semi-ellipsoid curvature and has a greater surface area than the first surface of the lower section.

20. The assembly of claim 14, wherein the second surface of the lower section has a semi-cylindrical curvature and has a greater surface area than the first surface of the lower section.

21. The assembly of claim 14, further comprising:
   at least one cooling fan positioned to direct an airflow onto at least one of the fin elements.

22. The assembly of claim 21, wherein the at least one cooling fan is attached to at least one of the fin elements.

23. The assembly of claim 14, wherein the lower section comprises a plate having a top surface and a bottom surface, the bottom surface comprising the first surface of the lower section, and a portion of the top surface being generally flat and adapted to contact a portion of the upper section.

24. The assembly of claim 14, wherein the at least one of the fin elements extend perpendicular from the upper section fourth surface.

25. The assembly of claim 14, wherein at least one of the fin elements extend radially from the convex curvature of the upper section second surface.

26. A heatsink assembly for removing heat from an electronic component, the heatsink assembly comprising:
   a copper-based core section having a first surface configured to conform to an exposed mating surface of an electronic device, and a second surface having a generally convex curvature, the second surface having a greater surface area than the first surface; and
   an aluminum-based outer section having a third surface comprising a concave curvature that is configured to directly contact the core element, a fourth surface comprising a convex curvature, and a plurality of fin elements protruding outward from the fourth surface;
   wherein the core section and the outer section are joined by a finger-joint type connection.

27. The heatsink assembly of claim 26, further comprising:

at least one cooling fan attached to the outer section and positioned to direct airflow onto at least one of the fin elements.

28. The heatsink assembly of claim 26, wherein the core section comprises a shape selected from the group consisting of semi-spherical, semi-ellipsoid, semi-cylindrical and bell shaped.

29. A method for cooling a heat source comprising:

providing a heatsink comprising: a core segment having a first surface to contact the heat source and a second surface having a generally convex curvature and having a greater surface area than the first surface; an outer segment having a third surface with a generally concave curvature in direct contact with the second surface of the core segments and coupled to the second surface through a finger-joint type connection, and a fourth surface having a plurality of fin elements protruding from it; attaching the heatsink to the heat source; and cooling the heat source by conducting heat from the heat source to the core segment, through the core segment in a radial direction to the greater surface area of the second surface of the core segment, to the outer segment where the heat is conducted to the fin elements and convected to a surrounding air mass.

30. The method of claim 29, wherein the heatsink further comprises a cooling fan that directs a forced airflow onto the fin elements.

31. The method of claim 29, wherein the core segment has a greater thermal conductivity than the outer segment.

32. The method of claim 29, wherein the core segment is made of a copper-based material.

33. A method of manufacture of a heatsink comprising:

providing a core segment having a first surface to contact a heat source and a second surface having a generally convex curvature and having a greater surface area than the first surface;

providing an outer segment having a third surface with a generally concave curvature in direct contact with the second surface of the core segment and a fourth surface having a plurality of fin elements protruding from it; attaching the outer segment to the core segment so that the second surface of the core segment is in contact with the third surface of the outer segment;

wherein the third surface of the outer segment contacts the second surface of the core segment using a finger-joint type connection.

34. The method of manufacture of claim 33, wherein the core segment has a greater thermal conductivity than the outer segment.

35. The method of manufacture of claim 33, wherein the core segment is made of a copper-based material and the outer segment is made of an aluminum-based material.

36. The method of manufacture of claim 33, further comprising:

attaching the outer segment to the core segment without a bonding between the third surface of the outer segment with the second surface of the core segment.

* * * * *

UNITED STATES PATENT AND TRADEMARK OFFICE
CERTIFICATE OF CORRECTION

PATENT NO.    : 6,691,768 B2
DATED         : February 17, 2004
INVENTOR(S)   : Hsieh et al.

It is certified that error appears in the above-identified patent and that said Letters Patent is hereby corrected as shown below:

<u>Column 9,</u>
Line 15, please change "core segments" to -- core segment --.

Signed and Sealed this

Twenty-ninth Day of June, 2004

JON W. DUDAS
*Acting Director of the United States Patent and Trademark Office*